US009778695B1

(12) United States Patent
Shibayama et al.

(10) Patent No.: US 9,778,695 B1
(45) Date of Patent: Oct. 3, 2017

(54) DOCKING STATION AND ELECTRONIC DEVICE SYSTEM

(71) Applicant: LENOVO (SINGAPORE) PTE. LTD., Singapore (SG)

(72) Inventors: Yoshiyuki Shibayama, Takasaki (JP); Yuta Tsuganezawa, Yokohama (JP); Eiji Shinohara, Kawasaki (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/244,682

(22) Filed: Aug. 23, 2016

(30) Foreign Application Priority Data

May 27, 2016  (JP) .................................. 2016-105927

(51) Int. Cl.
*G06F 1/16* (2006.01)
*G06F 1/20* (2006.01)
*H05K 7/20* (2006.01)

(52) U.S. Cl.
CPC .......... *G06F 1/1632* (2013.01); *G06F 1/1679* (2013.01); *G06F 1/203* (2013.01); *H05K 7/20272* (2013.01)

(58) Field of Classification Search
CPC combination set(s) only.
See application file for complete search history.

(56) References Cited

U.S. PATENT DOCUMENTS

| 5,684,673 | A | * | 11/1997 | Shibasaki | G06F 1/1632 361/679.42 |
|---|---|---|---|---|---|
| 5,969,939 | A | * | 10/1999 | Moss | G06F 1/203 361/679.41 |
| 6,181,553 | B1 | * | 1/2001 | Cipolla | G06F 1/1632 165/104.33 |
| 6,266,243 | B1 | * | 7/2001 | Tomioka | G06F 1/203 165/104.33 |
| 6,275,945 | B1 | * | 8/2001 | Tsuji | G06F 1/203 361/679.4 |
| 6,341,320 | B1 | * | 1/2002 | Watts, Jr. | G06F 1/1632 361/679.42 |
| 6,353,536 | B1 | * | 3/2002 | Nakamura | G06F 1/20 361/679.41 |
| 6,453,378 | B1 | * | 9/2002 | Olson | G06F 1/1632 361/679.41 |
| 6,504,710 | B2 | * | 1/2003 | Sutton | B60R 11/0252 312/223.1 |

(Continued)

*Primary Examiner* — Lisa Lea Edmonds
(74) *Attorney, Agent, or Firm* — Shimokaji IP

(57) ABSTRACT

There is provided a docking station to which a portable computing device is removably connected. The docking station includes: a device chassis; an engaging lever protruding from the outer surface of the device chassis and engageable with an engaging hole provided in the portable computing device; an electric mechanism which moves the engaging lever in a direction opposite to a direction of being engaged with the engaging hole to release a state of being engaged with the engaging hole; a manual operation part operable from an opening provided in the outer surface of the device chassis to move the engaging lever in the direction opposite to the direction of being engaged with the engaging hole so as to release the state of being engaged with the engaging hole; and a lock mechanism having a lock wall which obstructs the opening openably and closably.

11 Claims, 9 Drawing Sheets

(56) References Cited

U.S. PATENT DOCUMENTS

| | | | | |
|---|---|---|---|---|
| 6,542,360 B2* | 4/2003 | Koizumi | ................ | G06F 1/203 |
| | | | | 165/80.3 |
| 6,599,090 B2* | 7/2003 | Ozaki | ................... | G06F 1/203 |
| | | | | 361/679.21 |
| 6,605,924 B2* | 8/2003 | Tanaka | ................. | G06F 1/1632 |
| | | | | 320/113 |
| 6,687,123 B2* | 2/2004 | Kitahara | .............. | G06F 1/1632 |
| | | | | 165/121 |
| 6,691,197 B2* | 2/2004 | Olson | ................... | G06F 1/1632 |
| | | | | 361/679.41 |
| 7,019,968 B2* | 3/2006 | Kitahara | .............. | G06F 1/1632 |
| | | | | 165/121 |
| 7,859,833 B2* | 12/2010 | Tanaka | ................ | E05B 73/0082 |
| | | | | 361/679.41 |
| 9,292,050 B2* | 3/2016 | Noguchi | .............. | G06F 1/1681 |
| 9,310,848 B2* | 4/2016 | Fujino | ................... | G06F 1/1681 |
| 2003/0202323 A1* | 10/2003 | Maeda | ................. | G06F 1/1632 |
| | | | | 361/679.41 |
| 2004/0120112 A1* | 6/2004 | Mullen | .............. | E05B 73/0082 |
| | | | | 361/679.41 |
| 2014/0085794 A1* | 3/2014 | Zawacki | .............. | G06F 1/1683 |
| | | | | 361/679.09 |

\* cited by examiner

DOCKING STATION AND ELECTRONIC DEVICE SYSTEM

FIELD OF THE INVENTION

The present invention relates to a docking station to which a portable computing device is removably connected.

BACKGROUND OF THE INVENTION

Conventionally, there have been docking stations to which portable computing devices are removably connected.

SUMMARY OF THE INVENTION

It is an object of the present invention to provide a docking station to which a portable computing device is removably connected.

A docking station according to the present disclosure includes: a device chassis; an engaging lever protruding from the outer surface of the device chassis and engageable with an engaging hole provided in a portable computing device; an electric mechanism which moves the engaging lever in a direction opposite to a direction of being engaged with the engaging hole to release a state of being engaged with the engaging hole; a manual operation part operable from an opening provided in the outer surface of the device chassis to move the engaging lever in the direction opposite to the direction of being engaged with the engaging hole so as to release the state of being engaged with the engaging hole; and a lock mechanism having a lock wall which obstructs the opening openably and closably.

According to the present invention, there is provided a docking station to which a portable computing device is removably connected.

DETAILED DESCRIPTION OF THE INVENTION

Figure 1:
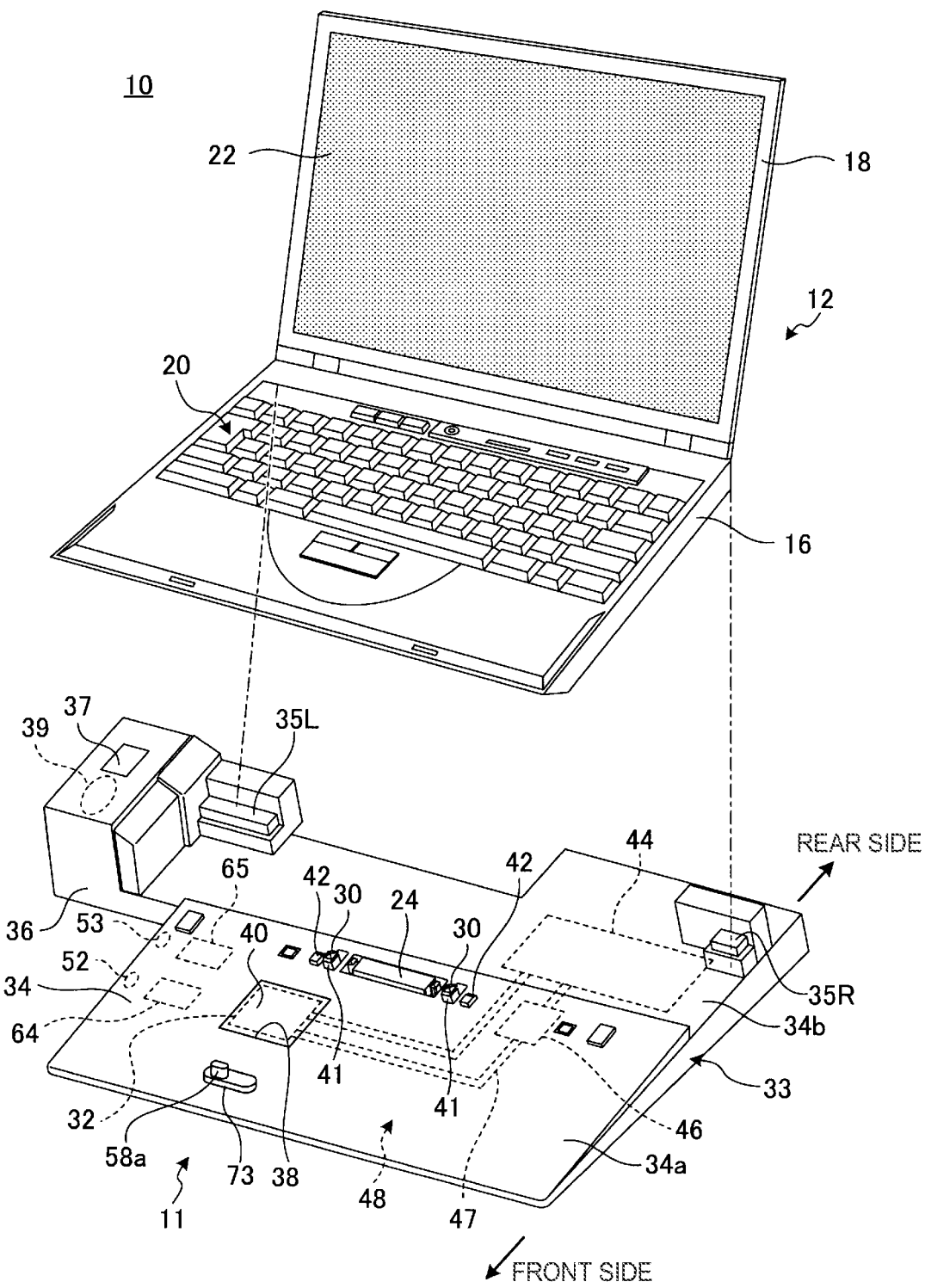
FIG. 1 is a configuration diagram of an electronic device system.
Figure 2:
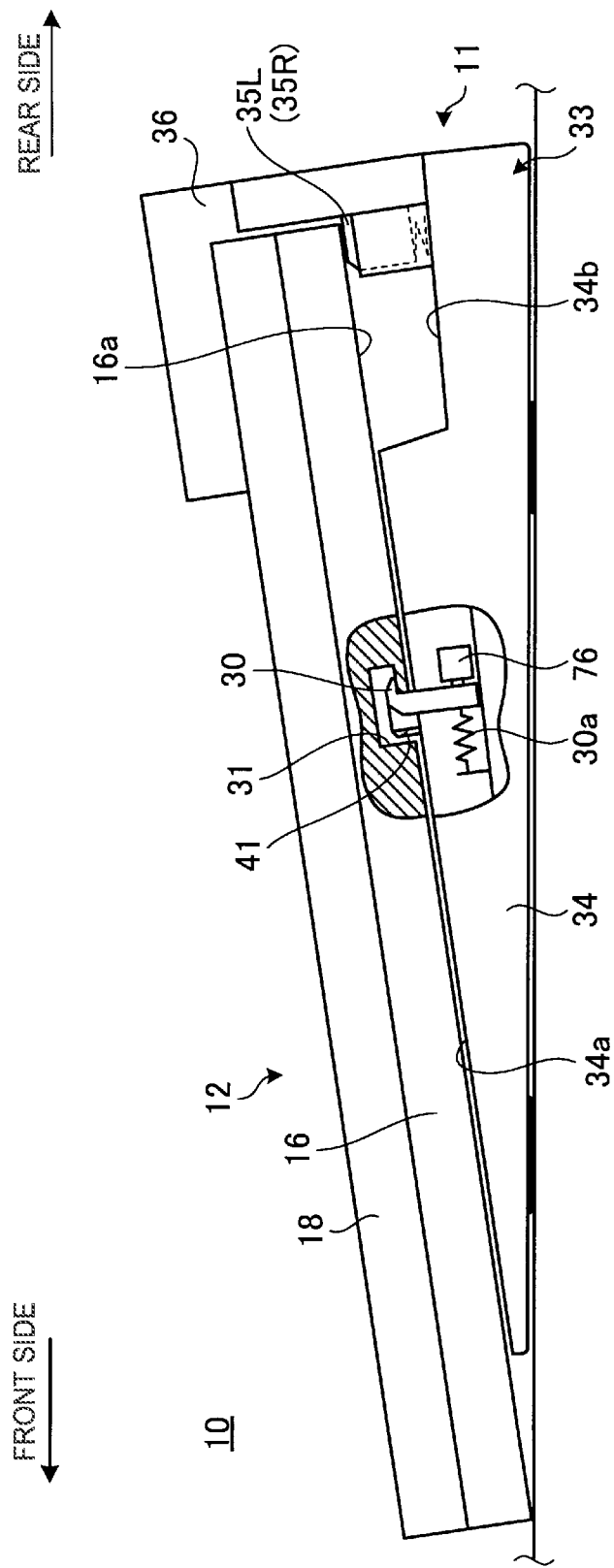
FIG. 2 is a partially sectional side view in a state where a docking station and a portable computing device illustrated in FIG. 1 are connected.
Figure 3:
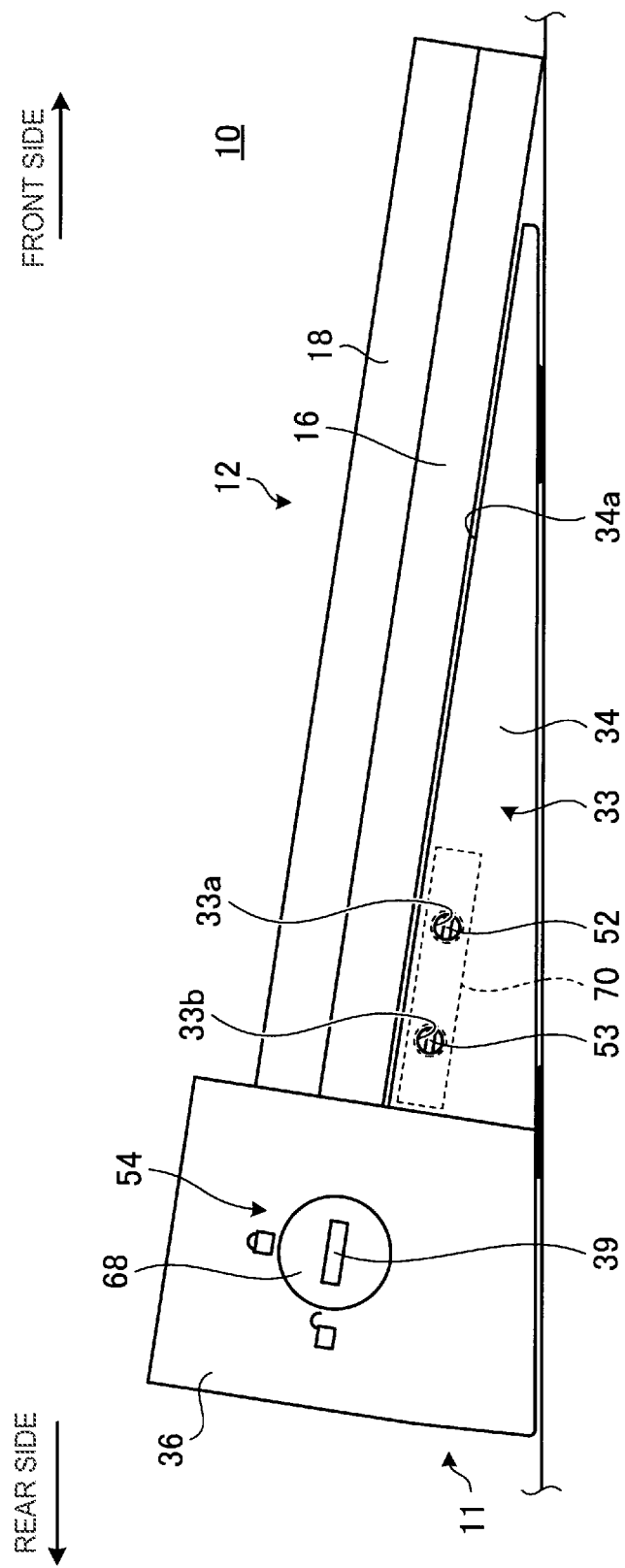
FIG. 3 is a side view when the electronic device system illustrated in FIG. 2 is viewed from the opposite side.
Figure 4:
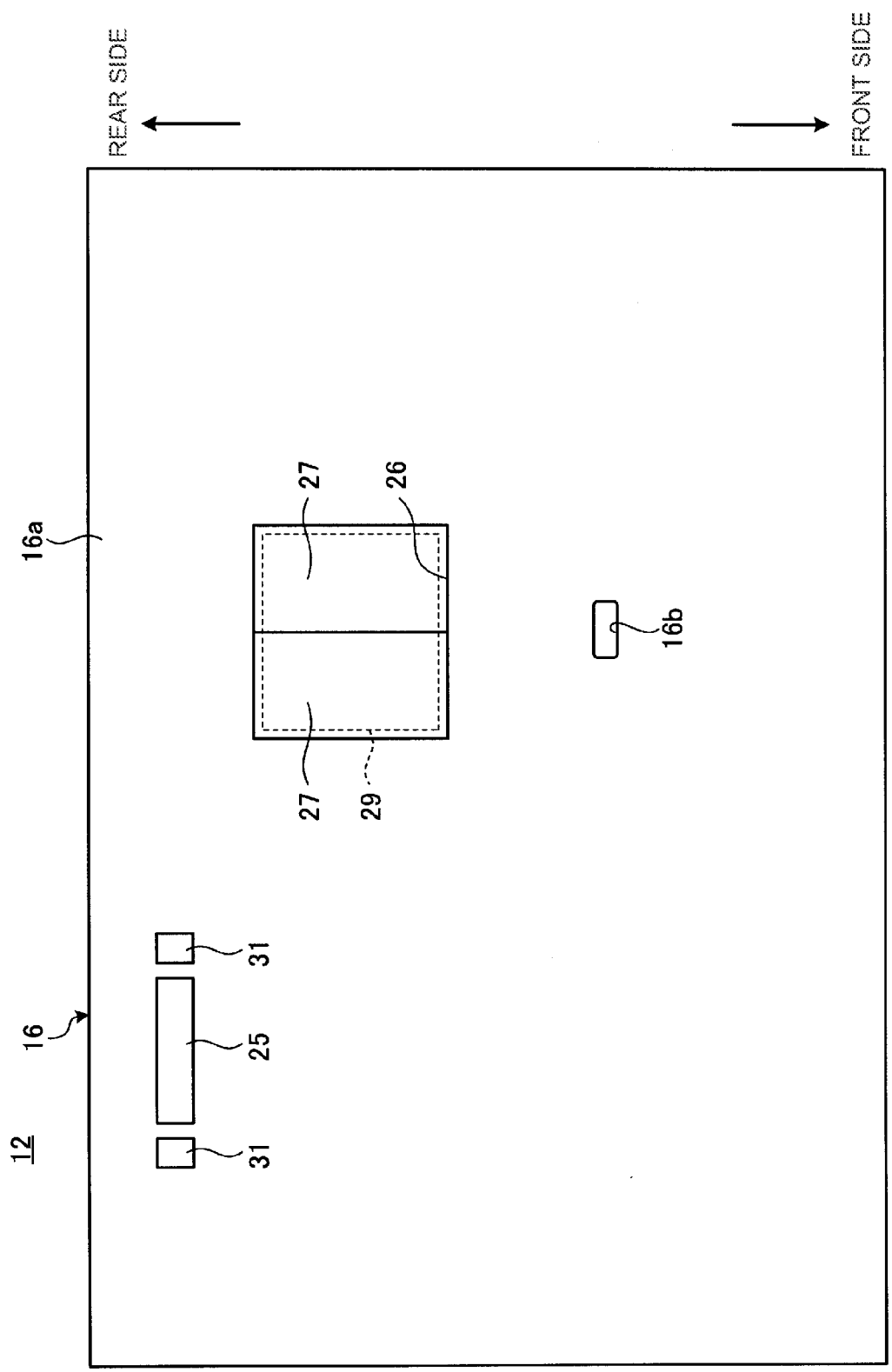
FIG. 4 is a bottom view schematically illustrating the structure of a bottom face of the portable computing device illustrated in FIG. 1.

FIG. 1 is a configuration diagram of an electronic device system 10 according to the present disclosure, which is a perspective view in a state where a docking station 11 and a portable computing device 12 are separated from each other. FIG. 2 is a partially sectional side view in a state where the docking station 11 and the portable computing device 12 illustrated in FIG. 1 are connected. FIG. 3 is a side view when the electronic device system 10 illustrated in FIG. 2 is viewed from the opposite side. FIG. 4 is a bottom view schematically illustrating the structure of a bottom face 16a of the portable computing device 12 illustrated in FIG. 1.

The present disclosure exemplifies the electronic device system 10 in which a laptop PC as an example of the portable computing device 12 is connected to the docking station 11 as a cooling device to reinforce the cooling function of the portable computing device 12. The docking station 11 may have a function to extend/reinforce a processing function of the portable computing device 12, a power supply function, and a connection function to a peripheral device or a network. The portable computing device 12 may be any device other than the laptop PC, that is, for example, it may be a tablet PC, a smartphone, or the like.

First, the general configuration of the electronic device system 10 will be described.

As illustrated in FIG. 1, the portable computing device 12 has a clamshell type structure in which a display chassis 18 is coupled openably and closably to a main body chassis 16. A keyboard 20 is provided on the top face of the main body chassis 16. A display 22 is provided on the front face of the display chassis 18.

As illustrated in FIG. 2 and FIG. 4, a connector 25 electrically connected to a connector 24 of the docking station 11, a rectangular opening 26, and a pair of engaging holes 31 are provided in the bottom face 16a of the main body chassis 16. The opening 26 is covered with a shutter member 27 openably and closably. The shutter member 27 is, for example, of a sliding double-opening structure. A heat-radiating side heat sink 29 openably and closably covered with the shutter member 27 is arranged inside the opening 26. The engaging holes 31 can be engaged with engaging levers 30 protruding from the side of the docking station 11.

The connector 25 is connected to an unillustrated substrate housed inside the main body chassis 16. The heat-radiating side heat sink 29 comes into contact with a heat-receiving side heat sink 32 on the side of the docking station 11 to extend the cooling function of the portable computing device 12. When the heat-radiating side heat sink 29 and the heat-receiving side heat sink 32 are brought into contact with and thermally connected to each other, heat generated inside the portable computing device 12 can be transmitted to the docking station 11 to radiate the heat to the outside. The shutter member 27 is to prevent the heat-radiating side heat sink 29 becoming a high temperature from being always exposed on the bottom face 16a of the portable computing device 12.

As illustrated in FIG. 1 to FIG. 3, the docking station 11 is used in a state where the main body chassis 16 of the portable computing device 12 is placed thereon. The docking station 11 is configured such that a PC placing part 34 and an operation part 36 are provided on a device chassis 33 formed out of a synthetic resin material or a metallic material.

The PC placing part 34 is a box body having a top face large enough to place the portable computing device 12 thereon. The PC placing part 34 has a placing face 34a and a flank face 34b. The placing face 34a is so inclined that the height will be increased gradually from the front side to the rear side to form a surface on which the bottom face 16a of the portable computing device 12 is landed. The flank face 34b is formed to be one step lower than the rear side of the placing face 34a. The flank face 34b is a lower part provided to stay away from an unillustrated battery or the like when the battery or the like projects from the rear bottom face of the portable computing device 12.

Supporting members 35L and 35R are provided in rear right and left end portions of the flank face 34b, respectively. The supporting members 35L and 35R are cushioning members provided to elastically support the rear end portions of the bottom face 16a of the portable computing device 12 to be movable up and down.

The connector 24 and a shutter member 40 to cover an opening 38 formed in the placing face 34a openably and closably are provided on the placing face 34a. Inside the opening 38, the heat-receiving side heat sink 32 is arranged and covered with the shutter member 40 openably and closably.

The connector 24 is connected to an unillustrated substrate or the like housed inside the PC placing part 34 to protrude from the placing face 34a. The connector 24, which constitutes connection terminals of various extended functions provided in the docking station 11, is connected to the connector 25 provided on the bottom face 16a of the portable computing device 12. When the connector 25 is connected to the connector 24, the docking station 11 and the portable computing device 12 are electrically connected, and this enables the portable computing device 12 to use the various extended functions provided in the docking station 11.

The engaging levers 30 protrude from the right and left sides of the connector 24, respectively, and upper portions thereof are exposed on the placing face 34a. Each engaging lever 30 is biased by a lever spring 30a in a direction (rearward) of being engaged with each of the engaging holes 31. A guide post 41 having a U-shape in plan view to surround three sides, i.e., the front side and the right and left sides of the engaging lever 30 is formed to protrude. When the portable computing device 12 is connected to the docking station 11, the guide post 41 is inserted together with the engaging lever 30 into the engaging hole 31 on the side of the portable computing device 12 to serve as a positioning pin for positioning the portable computing device 12 with respect to the device chassis 33. Further, an eject member 42 is provided at the side of each guide post 41 on the placing face 34a, respectively. When the portable computing device 12 is removed from the docking station 11, the eject member 42 rises after the engaged state of the engaging lever 30 with the engaging hole 31 is released to push up the bottom face 16a of the portable computing device 12.

A first manual operation part 52 and a second manual operation part 53 used to manually operate an electric mechanism 50 mounted inside the device chassis 33 are arranged on a side face near the side of the operation part 36 of the placing face 34a.

The operation part 36 is a rectangular parallelepiped part having a height greater than that of the PC placing part 34. The operation part 36 is provided in a rear position of one side of the PC placing part 34 (one side of the flank face 34b). The operation part 36 has an eject button (operation button) 37, and a key insertion hole 39. The eject button 37 is an operation button operated when the portable computing device 12 connected to the docking station 11 is removed. The eject button 37 is, for example, a push button elastically supported to be movable up and down. The key insertion hole 39 is, for example, an opening into which an unillustrated wire type lock key is inserted. When the wire type lock key is inserted into the key insertion hole 39 and rotated to a locked position, an input operation to the eject button 37 is disabled. This prevents the portable computing device 12 from being removed from the docking station 11 to protect against the theft of the portable computing device 12.

Next, a connection structure and a cooling structure of the docking station 11 and the portable computing device 12 will be specifically described.

Figure 5:
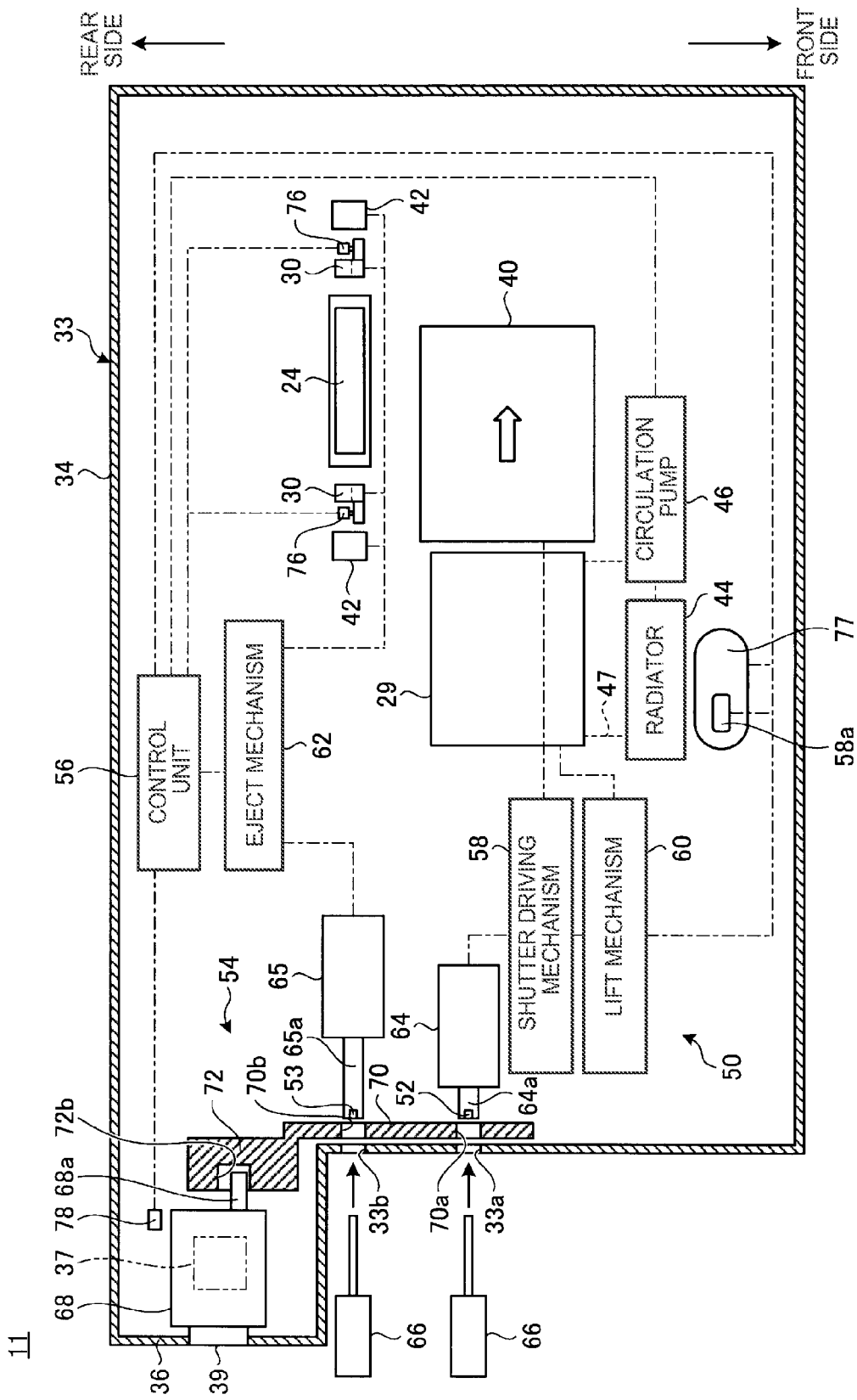
FIG. 5 is a plan view schematically illustrating an inner structure of the docking station.
Figure 6:
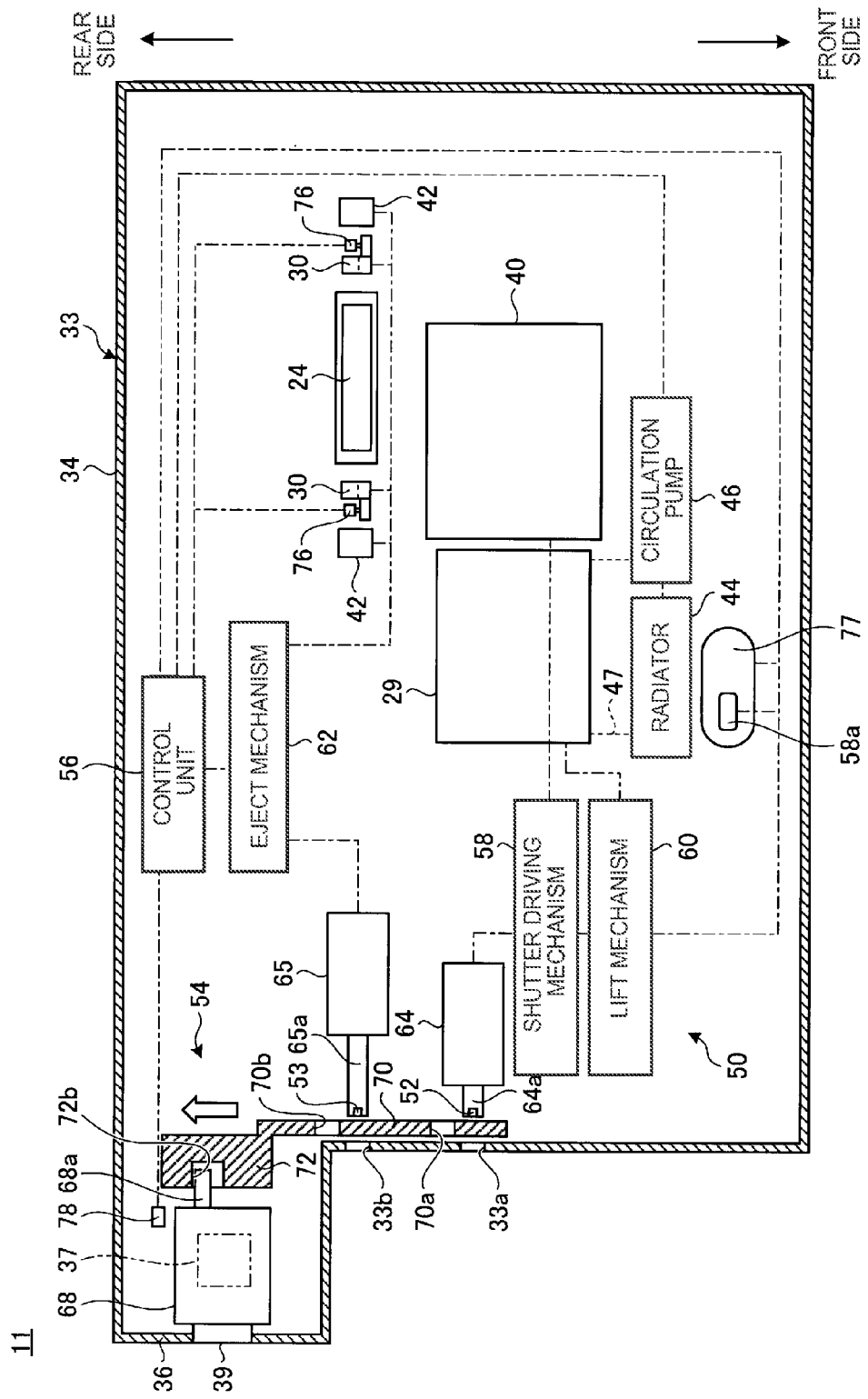
FIG. 6 is a plan view illustrating a locked state of manual operation parts of the docking station illustrated in FIG. 5.
Figure 7:
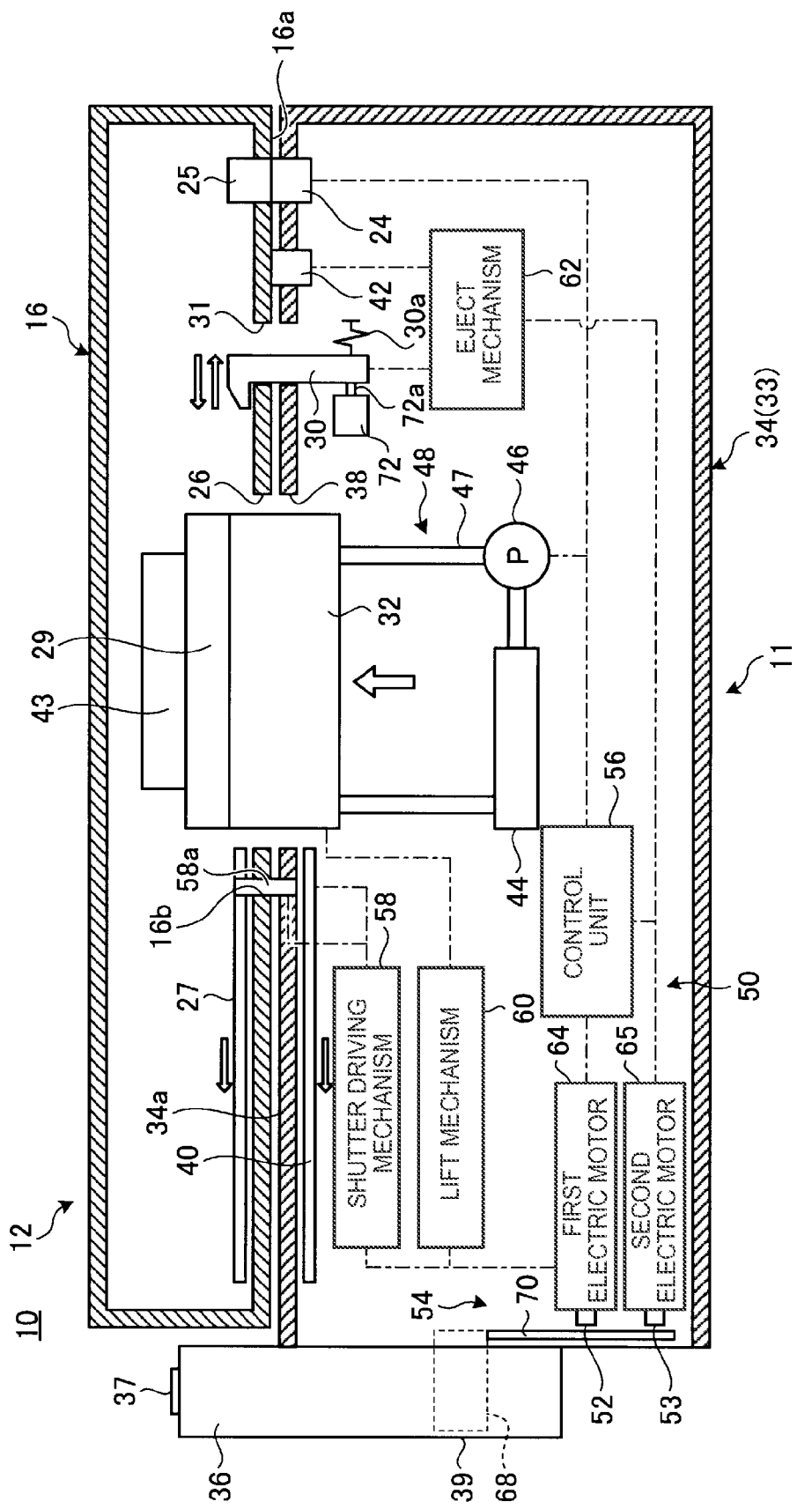
FIG. 7 is a side view schematically illustrating the inner structure when the docking station and the portable computing device are connected.

FIG. 5 is a plan view schematically illustrating an inner structure of the docking station 11. FIG. 6 is a plan view illustrating a locked state of the manual operation parts 52, 53 of the docking station 11 illustrated in FIG. 5. FIG. 7 is a side view schematically illustrating the inner structure when the docking station 11 and the portable computing device 12 are connected.

As illustrated in FIG. 4 and FIG. 7, the portable computing device 12 has, in the bottom face 16a, the heat-radiating side heat sink 29 provided openably and closably with the shutter member 27. The heat-radiating side heat sink 29 is a rectangular plate-like member made of a metallic material having high thermal conductivity such as copper or aluminium. The heat-radiating side heat sink 29 is thermally connected to a heating element 43 provided inside the main body chassis 16. The heating element 43 is an electronic component such as a CPU (Central Processing Unit) or a GPU (Graphics Processing Unit). Heat generated by the heating element 43 is transmitted efficiently to the heat-radiating side heat sink 29.

As illustrated in FIG. 1, FIG. 5, and FIG. 7, the docking station 11 includes a water-cooling unit 48 for circularly connecting the heat-receiving side heat sink 32, a radiator 44, and a circulation pump 46 through piping 47 to circulate cooling water.

The heat-receiving side heat sink 32 is a rectangular plate-like member made of a metallic material having high thermal conductivity such as copper or aluminium. Inlet piping 47 and outlet piping 47 are connected to the heat-receiving side heat sink 32 so that the cooling water will circulate in a cooling water circulating space with unillustrated fins arranged internally. This cooling water circulating space is formed inside of a thin lid that forms the top face of the heat-receiving side heat sink 32. The multiple fins are arranged in parallel with one another at predetermined intervals inside the cooling water circulating space in such a state that the end faces thereof are in contact with the inner face of the lid. Thus, the heat-receiving side heat sink 32 serves as a water-cooling jacket structure for heat exchange between the fins and the cooling water because the cooling water circulates around the fins inside the cooling water circulating space.

In the water-cooling unit 48, cooling water with heat radiated from the radiator 44 is introduced into the heat-receiving side heat sink 32 through the circulation pump 46. The cooling water with heat from the heat-radiating side heat sink 29 recovered in the heat-receiving side heat sink 32 is introduced again into the radiator 44. Thus, the heat-receiving side heat sink 32 can cool the heat-radiating side heat sink 29 with a high cooling efficiency.

As illustrated in FIG. 5 and FIG. 7, the docking station 11 includes the electric mechanism 50, the first manual operation part 52 and the second manual operation part 53, a lock mechanism 54, and a control unit 56.

The electric mechanism 50 has a shutter driving mechanism 58, a lift mechanism 60, and an eject mechanism 62. The electric mechanism 50 is equipped with a first electric motor 64 and a second electric motor 65. The first electric motor 64 activates the shutter driving mechanism 58 and the lift mechanism 60. The second electric motor 65 activates the eject mechanism 62.

The shutter driving mechanism 58 is a mechanism section configured to drive the shutter member 27 and the shutter member 40 to be opened and closed. The shutter driving mechanism 58 has a rack gear or a link member, and the like, which receive a driving force of the first electric motor 64 to activate the shutter member 40 and a shutter-opening/closing member 58a. The shutter-opening/closing member 58a is a thin plate-like member. The shutter driving mechanism 58 slidingly moves the shutter member 40 to be opened and closed under the control of the control unit 56. Further, the shutter driving mechanism 58 drives the shutter-opening/closing member 58a to rotate so as to open and close the shutter member 27 as well, where the shutter-opening/closing member 58a is inserted in a hole 16b formed in the bottom face 16a of the portable computing device 12 connected to the docking station 11.

The lift mechanism 60 is a mechanism section configured to drive the heat-receiving side heat sink 32 to move up and down. The lift mechanism 60 has a guide member and the like, which receive the driving force of the first electric motor 64 to lift the heat-receiving side heat sink 32 up and down. The lift mechanism 60 lifts the heat-receiving side heat sink 32 up and down under the control of the control unit 56. The piping 47 among the heat-receiving side heat sink 32 having the water-cooling jacket structure to be lifted up and down by the lift mechanism 60, the radiator 44, and the circulation pump 46 is made up of flexible hose-like members.

The eject mechanism 62 is a mechanism section configured to drive the engaging lever 30 and the eject member 42 when the portable computing device 12 connected to the docking station 11 is removed. The eject mechanism 62 has a rack gear or a link member, and the like, which receive a driving force of the second electric motor 65 to activate the engaging lever 30 and the eject member 42. The eject mechanism 62 moves the engaging lever 30 under the control of the control unit 56 against a biasing force of an unillustrated elastic body to release the engaged state of the engaging lever 30 with the engaging hole 31. Further, the eject mechanism 62 lifts up the eject member 42 under the control of the control unit 56 to push up the bottom face 16a so that the portable computing device 12 will pop up.

As illustrated in FIG. 3 and FIG. 5, the first manual operation part 52 is formed on the distal end face of a rotating shaft 64a of the first electric motor 64. The first manual operation part 52 is a groove part into which the tip of a tool 66 such as a slotted screwdriver is fitted to rotate the rotating shaft 64a manually. The first manual operation part 52 is arranged inside an opening 33a provided in a side face of the device chassis 33 (PC placing part 34). The opening 33a is a through-hole into which the tip of the tool 66 can be inserted. The first manual operation part 52 can be operated from the outside of the device chassis 33 through the opening 33a. The first manual operation part 52 is manually operated using the tool 66 to rotate the first electric motor 64 manually to enable the shutter driving mechanism 58 and the lift mechanism 60 to be activated manually.

The second manual operation part 53 is formed on the distal end face of a rotating shaft 65a of the second electric motor 65. The second manual operation part 53 is a groove part into which the tip of the tool 66 is fitted to rotate the rotating shaft 65a manually. The second manual operation part 53 is arranged inside an opening 33b provided in the side face of the device chassis 33 (PC placing part 34). The opening 33b is a through-hole into which the tip of the tool 66 can be inserted. The second manual operation part 53 can be operated from the outside of the device chassis 33 through the opening 33b. The second manual operation part 53 is manually operated using the tool 66 to rotate the second electric motor 65 manually to enable the eject mechanism 62 to be activated manually.

Figure 8A:
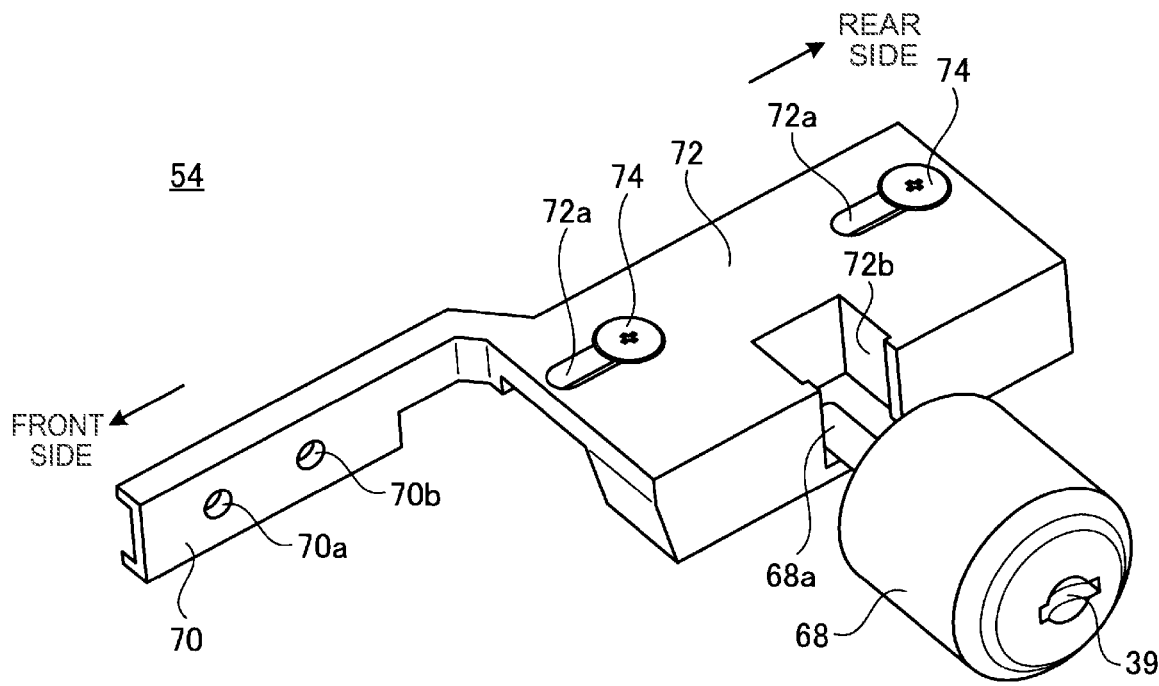
FIG. 8A is a perspective view illustrating the structure of a lock mechanism located in an unlocked position.
Figure 8B:
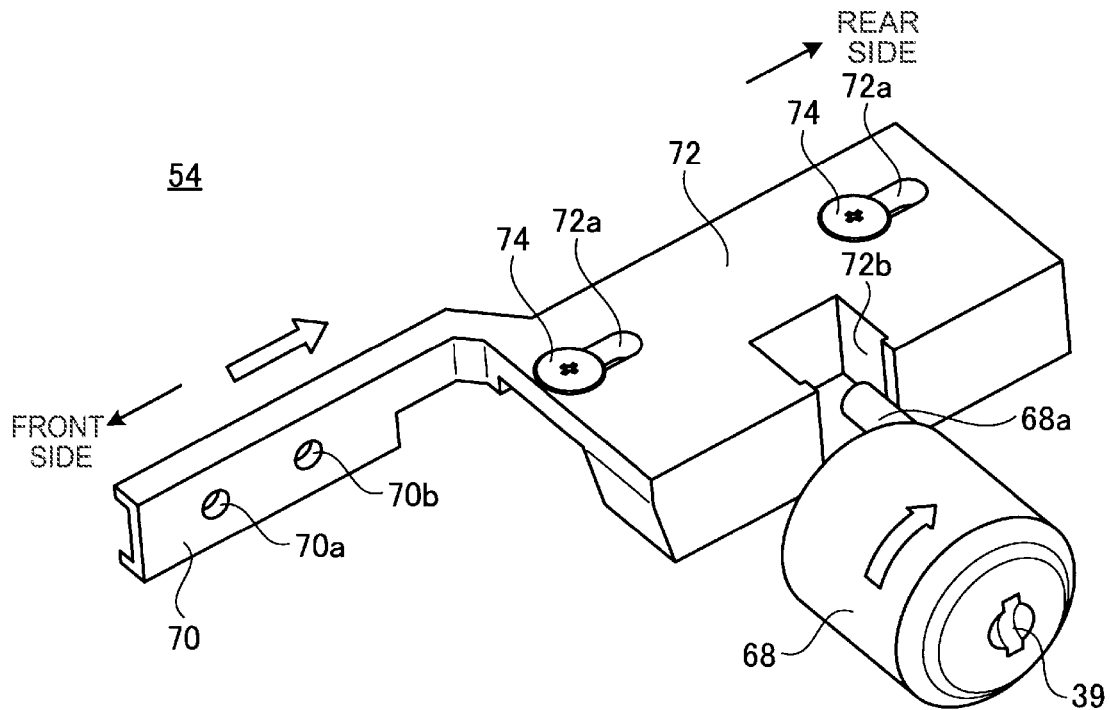
FIG. 8B is a perspective view illustrating the structure of the lock mechanism located in a locked position.
Figure 9A:
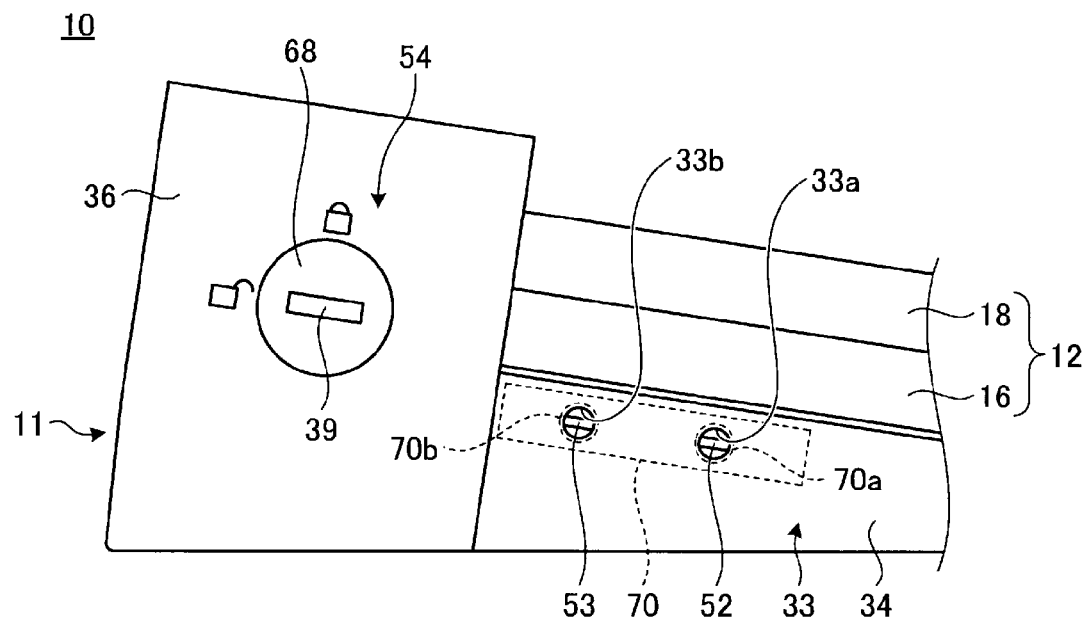
FIG. 9A is a side view schematically illustrating a state of manual operation parts when the lock mechanism is located in the unlocked position.
Figure 9B:
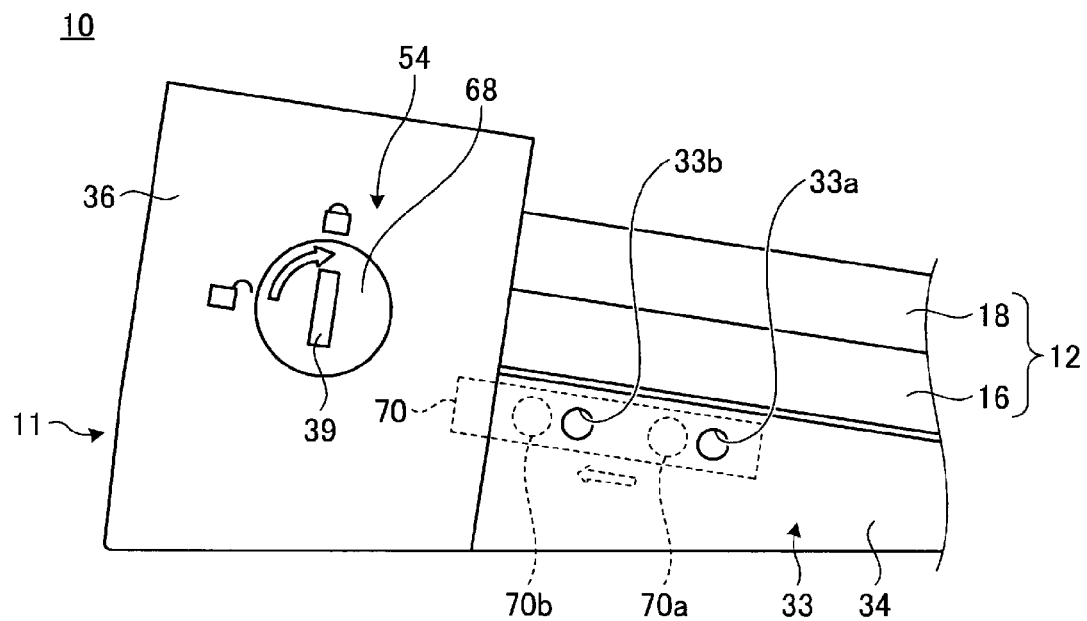
FIG. 9B is a side view schematically illustrating a state of the manual operation parts when the lock mechanism is located in the locked position.

FIG. 8A is a perspective view illustrating the structure of the lock mechanism 54 in an unlocked position. FIG. 8B is a perspective view illustrating the structure of the lock mechanism 54 in a locked position. FIG. 9A is a side view schematically illustrating a state of the manual operation parts 52, 53 when the lock mechanism 54 is located in the unlocked position. FIG. 9B is a side view schematically illustrating a state of the manual operation parts 52, 53 when the lock mechanism 54 is located in the locked position.

As illustrated in FIG. 5, FIG. 8A, and FIG. 8B, the lock mechanism 54 has a key cylinder 68 and a lock wall 70.

The key cylinder 68 is arranged on the outer surface of the device chassis 33 (operation part 36) with a key insertion hole 39 exposed thereon in a manner to be rotatable inside the operation part 36. A link bar 68a is formed to protrude on an end face on a side opposite to the side of the key insertion hole 39 of the key cylinder 68 to transmit the rotation of the key cylinder 68 to the lock wall 70. When the key cylinder 68 is rotated from the unlocked position to the locked position, the position of the link bar 68a in the front and rear direction moves from the front side to the rear side. When the key cylinder 68 is rotated from the locked position to the unlocked position, the position of the link bar 68a in the front and rear direction moves from the rear side to the front side.

The lock wall 70 is a thin plate-like member extending in the front and rear direction along the side face of the device chassis 33 in which the openings 33a, 33b corresponding to the manual operation parts 52, 53 are provided. The lock wall 70 is movable in the front and rear direction along the inner side face of the device chassis 33. A pair of through-holes 70a, 70b provided at the same pitch as that between the openings 33a, 33b are formed in the lock wall 70. Each through-hole 70a, 70b is a through-hole into which the tip of the tool 66 can be inserted. A link slider 72 driven in the front and rear direction by the link bar 68a of the key cylinder 68 is provided integrally with the lock wall 70 in the rear end portion of the lock wall 70. The link slider 72 has a pair of front and rear long holes 72a extending in the front and rear direction, and a depressed portion 72b formed in a side face that faces the key cylinder 68. A guide screw 74 fixed to the inner face of the device chassis 33 is inserted in each long hole 72a. The link bar 68a is inserted in the depressed portion 72b.

When the key cylinder 68 is rotated from the unlocked position (see FIG. 5 and FIG. 8A) to the locked position (see FIG. 7 and FIG. 8B), the link bar 68a presses the wall surface of the depressed portion 72b while moving from the front side to the rear side inside the depressed portion 72b of the link slider 72. As a result, the link slider 72 moves from the front side to the rear side under the guiding action of the guide screw 74, and the lock wall 70 moves from the front side to the rear side as well. When the key cylinder 68 is rotated from the locked position to the unlocked position, the lock wall 70 moves from the rear side to the front side.

As illustrated in FIG. 5 and FIG. 9A, when the key cylinder 68 is located in the unlocked position, the lock wall 70 comes to a position where each through-hole 70a, 70b is located between each manual operation part 52, 53 and each opening 33a, 33b. Namely, each opening 33a, 33b, each through-hole 70a, 70b, and each manual operation part 52, 53 are arranged on a substantially coaxial line. In other words, the lock wall 70 opens up each opening 33a, 33b and each manual operation part 52, 53. Therefore, in the unlocked position, the tool 66 can be fitted in each manual operation part 52, 53 from each opening 33a, 33b through each through-hole 70a, 70b. As a result, the manual operation part 52, 53 can be operated to rotate by the tool 66 from the outside of the device chassis 33. Further, in the unlocked position, an input operation to the eject button 37 is enabled.

As illustrated in FIG. 7 and FIG. 9B, when the key cylinder 68 is located in the locked position, the lock wall 70 comes to a position where each through-hole 70a, 70b is deviated from the position between each manual operation part 52, 53 and each opening 33a, 33b. In other words, the lock wall 70 obstructs a gap between each opening 33a, 33b and each manual operation part 52, 53. Therefore, in the locked position, the tool 66 inserted from each opening 33a, 33b is blocked by the lock wall 70 and cannot be fitted into each manual operation part 52, 53. As a result, the manual operation part 52, 53 cannot be operated to rotate by the tool 66 from the outside of the device chassis 33. Further, in the locked position, an input operation to the eject button 37 is disabled.

The control unit 56 performs not only the overall control of the docking station 11 but also the driving control of the water-cooling unit 48 and the electric mechanism 50. In response to detection signals of a docking sensor 76 to be turned on and off by the engaging lever 30 and an On sensor 77 to be turned on and off by the bottom face 16a of the portable computing device 12, the control unit 56 controls switching of the docking station 11 from a standby state to an operating state. In the present disclosure, for example, the standby state means a state where the portable computing device 12 is not connected to the docking station 11 so that the detection signal from the docking sensor 76 will be receivable. In this standby state, the water-cooling unit 48 and the electric mechanism 50 are in a stopped state. In the present disclosure, for example, the operating state means a state where the portable computing device 12 is connected to the docking station 11 so that cooling operation by the water-cooling unit 48 will be being performed. The operation of each of the shutter driving mechanism 58, the lift mechanism 60, and the eject mechanism 62 that constitute the electric mechanism 50 is also performed in the operating state. In response to a detection signal of an unillustrated removal sensor to be turned on and off by the supporting members 35L and 35R, the control unit 56 controls switching of the docking station 11 from the operating state to the standby state. Further, in response to a detection signal of a lock sensor 78 placed along the key cylinder 68 of the lock mechanism 54, the control unit 56 controls the power on and off of the docking station 11. In the present disclosure, for example, when the key cylinder 68 is located in the unlocked position, the docking station 11 is powered on and becomes the standby state or the operating state. On the other hand, when the key cylinder 68 is located in the locked position, the docking station 11 is powered off, and detection at the docking sensor 76 and the like is stopped as well.

The control unit 56 may be implemented in such a manner, for example, that a program is executed by a processor such as a CPU, i.e., in software, implemented in hardware such as an IC (Integrated Circuit), or implemented by using the software and hardware in combination.

Next, the operation of the electronic device system 10 will be described.

First, when the portable computing device 12 is not connected to the docking station 11, the heat-radiating side heat sink 29 is closed by the shutter member 27 and the heat-receiving side heat sink 32 is closed by the shutter member 40. This prevents a user from touching the heat-radiating side heat sink 29 or the heat-receiving side heat sink 32 by mistake. At this time, a lock key is inserted into the key insertion hole 39 to set the lock mechanism 54 to the unlocked position. Thus, the docking station 11 is powered on and becomes the standby state, and the control unit 56 becomes a state of waiting for detection signals from the docking sensor 76 and the On sensor 77.

Next, when the portable computing device 12 is connected to the docking station 11 in the standby state, the connector 24 and the connector 25 are connected while inserting each engaging lever 30 of the portable computing device 12 into each engaging hole 31 as illustrated in FIG. 6. Thus, the connector 24 and the connector 25 are electrically connected. Further, the engaging lever 30 is engaged with the engaging hole 31 to block the portable computing device 12 from being separated from the docking station 11.

During this connection operation, the top face of the engaging lever 30 slidingly contacts the marginal part of the engaging hole 31 and once moves in a direction opposite to the direction of being engaged with the engaging hole 31 against a biasing force of the lever spring 30a. Then, when the top face climbs over the marginal part of the engaging hole 31, the engaging lever 30 moves in the engaged direction by the biasing force of the lever spring 30a, and is engaged with the engaging hole 31. Therefore, after an Off signal is transmitted from a state where a detection switch of the docking sensor 76 comes into contact with the engaging lever 30 to transmit an On signal, the docking sensor 76 transmits the On signal again. Note that the On sensor 77 is pressed to fall by the bottom face 16a of the portable computing device 12 so as to transmit the On signal.

When receiving the detection signals as the Off signal and the On signal sequentially transmitted from the docking sensor 76, and the detection signal as the On signal from the On sensor 77, the control unit 56 switches the docking station 11 from the standby state to the operating state. The On sensor 77 may be so omitted that the detection from the docking sensor 76 alone will be used to switch the docking station 11 from the standby state to the operating state.

When the docking station 11 is switched to the operating state, the shutter driving mechanism 58 is first activated under the control of the control unit 56 to open the shutter member 27 and the shutter member 40. Next, the lift mechanism 60 is activated to lift up and bring the heat-receiving side heat sink 32 into press contact with the heat-radiating side heat sink 29 so that both will stick fast to each other. After that, the control unit 56 controls the driving of the circulation pump 46 at a predetermined rotational speed. Thus, heat generated by the heating element 43 of the portable computing device 12 is radiated from the radiator 44 to the outside via the heat-radiating side heat sink 29 and the heat-receiving side heat sink 32.

In the event of a power outage or the like when the portable computing device 12 is connected to the docking station 11, the electric mechanism 50 cannot be activated to remove the portable computing device 12 from the docking station 11. Therefore, in such an emergency, the tool 66 is inserted into each manual operation part 52, 53 in a state where the lock mechanism 54 is set to the unlocked position. Then, the shutter driving mechanism 58, the lift mechanism 60, and the eject mechanism 62 that constitute the electric mechanism 50 are activated manually. Thus, the heat-receiving side heat sink 32 is separated from the heat-radiating side heat sink 29 to put the shutter members 27, 40 in closed positions so that the engaged state of the engaging lever 30 with the engaging hole 31 can be released.

On the other hand, when use of the docking station is terminated or the like in the state where the portable computing device 12 is connected to the docking station 11, the portable computing device 12 is, for example, shut down. Then, the lock key is inserted into the key insertion hole 39 and rotated to set the lock mechanism 54 to the locked position. Thus, the docking station 11 is powered off. This disables an input operation to the eject button 37, and hence disables the removal of the portable computing device 12 from the docking station 11 using the electric mechanism 50. Simultaneously, the lock wall 70 obstructs a gap between each opening 33a, 33b and each manual operation part 52, 53 (see FIG. 7 and FIG. 9B). As a result, any third person cannot also operate the electric mechanism 50 manually from each manual operation part 52, 53 to remove the portable computing device 12 from the docking station 11, achieving a high level of antitheft performance.

Next, when the portable computing device 12 is removed from the docking station 11, the eject button 37 is operated to perform an undocking operation in a state where the lock mechanism 54 is set to the unlocked position. This undocking operation may be performed by a software input operation using input means such as the keyboard 20 or an unillustrated mouse of the portable computing device 12. When the undocking operation is performed, the control unit 56 activates the eject mechanism 62 to separate the engaging lever 30 from the engaging hole 31 and push up the eject member 42 so that the portable computing device 12 will pop up from the placing face 34a. Thus, the connected state of the portable computing device 12 and the docking station 11 is released.

After the portable computing device 12 is popped up, the portable computing device 12 is picked up off the placing face 34a. Then, the supporting members 35L and 35R rise as illustrated in FIG. 1, and the removal sensor transmits the Off signal. The control unit 56 activates the lift mechanism 60 to lift down the heat-receiving side heat sink 32 so as to separate it from the heat-radiating side heat sink 29. Subsequently, the control unit 56 activates the shutter driving mechanism 58 to close the shutter member 27 and the shutter member 40. Thus, since the removal of the portable computing device 12 from the docking station 11 is completely finished, the control unit 56 switches the docking station 11 again from the operating state to the standby state.

As described above, the docking station 11 according to the present disclosure includes: a device chassis 33; an engaging lever 30 protruding from the outer surface of the device chassis 33 and engageable with an engaging hole 31 provided in a portable computing device 12; an electric mechanism 50 which moves the engaging lever 30 in a direction opposite to a direction of being engaged with the engaging hole 31 to release a state of being engaged with the engaging hole 31; a second manual operation part 53 operable from an opening 33b provided in the outer surface of the device chassis 33 to move the engaging lever 30 in the direction opposite to the direction of being engaged with the engaging hole 31 so as to release the state of being engaged with the engaging hole 31; and a lock mechanism 54 having a lock wall 70 which obstructs the opening 33b openably and closably.

In an emergency such as a power outage when the portable computing device 12 is connected to the docking station 11, even if the action of the electric mechanism 50 is disabled, a manual operation using the second manual operation part 53 can be performed. As a result, the engaged state of the engaging lever 30 with the engaging hole 31 can be released manually and hence the portable computing device 12 can be removed from the docking station 11. In addition, this second manual operation part 53 can be obstructed by the lock wall 70 to prevent an unauthorized operation of the second manual operation part 53 by a third person, achieving a high level of antitheft performance.

In the present disclosure, such a structure that each manual operation part 52, 53 is used to operate the electric mechanism 50 manually is exemplified. However, for example, the first manual operation part 52 may be used to directly operate a gear, a link member, or the like that constitutes part of the shutter driving mechanism 58 or the lift mechanism 60. Further, for example, the second manual operation part 53 may be used to directly operate a gear constituting part of the eject mechanism 62 or the engaging lever 30. In other words, each manual operation part 52, 53 may have any structure other than the structure for operating the rotating shaft 64a, 65a of each electric motor 64, 65 to rotate.

It is needless to say that the present invention is not limited to the above disclosed content, and changes can be made freely without departing from the spirit of the present invention.

We claim:

1. A docking station comprising:
a device chassis;
an engaging lever protruding from an outer surface of the device chassis, the engaging lever is engageable with an engaging hole located in a portable computing device;
an electric mechanism which moves the engaging lever in a direction opposite to a direction of being engaged with the engaging hole to release a state of being engaged with the engaging hole;
a manual operation part operable from an opening located in the outer surface of the device chassis to move the engaging lever in the direction opposite to the direction of being engaged with the engaging hole so as to release the state of being engaged with the engaging hole; and
a lock mechanism having a lock wall which obstructs the opening openably and closably.

2. The docking station according to claim 1, wherein the manual operation part is configured to activate the electric mechanism manually.

3. The docking station according to claim 2, wherein:
the electric mechanism comprises an electric motor, and
wherein the manual operation part is configured to rotate a rotating shaft of the electric motor manually.

4. The docking station according to claim 1, wherein:
the lock mechanism comprises:

a key cylinder having a key insertion hole located in the outer surface of the device chassis, the lock wall moving along with a rotating action of the key cylinder.

5. The docking station according to claim 4, wherein:
when the key cylinder is rotated to a locked position, the lock wall moves to a position to obstruct the opening, and
when the key cylinder is rotated to an unlocked position, the lock wall moves to a position to open up the opening.

6. The docking station according to claim 5, further comprising:
an operation button for activating the electric mechanism to release the engaged state of the engaging lever with the engaging hole,
wherein when the key cylinder is in the locked position, the operation button disables an input operation,
wherein when the key cylinder is in the unlocked position, the operation button enables the input operation.

7. The docking station according to claim 1, further comprising:
a heat-receiving side heat sink thermally connected to a heat-radiating side heat sink that is thermally connected to a heating element mounted in the portable computing device to absorb heat of the heating element.

8. The docking station according to claim 7, further comprising:
a placing face configured to receive a bottom face of the portable computing device; and
a lift mechanism configured to lift the heat-receiving side heat sink up toward and brought into contact with the heat-radiating side heat sink located on the bottom face of the portable computing device,
wherein the lift mechanism can be activated by the electric mechanism and the manual operation part.

9. The docking station according to claim 8, further comprising:
a shutter member located on the placing face to cover the heat-receiving side heat sink openably and closably,
wherein the shutter member can be activated by the electric mechanism and the manual operation part.

10. The docking station according to claim 7, further comprising:
a water-cooling unit connected to a radiator, the heat-receiving side heat sink, and a circulation pump through piping to circulate cooling water.

11. An electronic device system comprising:
a portable computing device; and
a docking station to which the portable computing device is removably attached,
wherein the docking station comprises
a device chassis,
an engaging lever protruding from an outer surface of the device chassis, the engaging lever is engageable with an engaging hole located in the portable computing device,
an electric mechanism which moves the engaging lever in a direction opposite to a direction of being engaged with the engaging hole to release a state of being engaged with the engaging hole,
a manual operation part operable from an opening provided in the outer surface of the device chassis to move the engaging lever in the direction opposite to the direction of being engaged with the engaging hole so as to release the state of being engaged with the engaging hole,
a lock mechanism having a lock wall which obstructs the opening openably and closably.

* * * * *